(12) United States Patent
Reams

(10) Patent No.: US 8,362,908 B2
(45) Date of Patent: *Jan. 29, 2013

(54) SYSTEMS AND APPARATUS FOR BATTERY REPLACEMENT DETECTION AND REDUCED BATTERY STATUS TRANSMISSION IN A REMOTE CONTROL

(75) Inventor: William R. Reams, Englewood, CO (US)

(73) Assignee: EchoStar Technologies L.L.C., Englewood, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/033,429

(22) Filed: Feb. 23, 2011

(65) Prior Publication Data

US 2011/0163886 A1 Jul. 7, 2011

Related U.S. Application Data

(63) Continuation of application No. 12/117,628, filed on May 8, 2008, now Pat. No. 7,907,060.

(51) Int. Cl.
*G08B 21/00* (2006.01)
(52) U.S. Cl. ............. 340/636.15; 340/635; 340/636.1; 340/691.1; 341/176; 341/178; 324/76.11; 324/157; 324/426; 324/437; 348/734; 348/E5.095
(58) Field of Classification Search ............ 340/636.15, 340/636.1, 635, 691.1; 324/76.11–157, 426, 324/437; 320/116, 134, 136; 348/734, E5.095; 455/352; 702/63; 341/176, 178
See application file for complete search history.

(56) References Cited

U.S. PATENT DOCUMENTS

| | | | |
|---|---|---|---|
| 4,067,000 | A | 1/1978 | Carlson |
| 4,231,026 | A | 10/1980 | Sullivan |
| 4,578,671 | A | 3/1986 | Flowers |
| 4,598,243 | A | 7/1986 | Kawakami |
| 5,115,236 | A | 5/1992 | Koehler |
| 5,164,652 | A | 11/1992 | Johnson et al. |

(Continued)

FOREIGN PATENT DOCUMENTS

| | | |
|---|---|---|
| JP | 01114298 A | 5/1989 |
| JP | 04148499 A | 5/1992 |

(Continued)

OTHER PUBLICATIONS

European Patent Office "International Search Report" mailed Jul. 8, 2009 for International Appln. PCT/US2009/042651.

(Continued)

*Primary Examiner* — George A. Bugg
*Assistant Examiner* — Sisay Yacob
(74) *Attorney, Agent, or Firm* — Ingrassia Fisher & Lorenz, P.C.

(57) ABSTRACT

Various mechanisms are described for indicating to a user a low battery condition of a remote control for a controlled device. More particularly, a remote control detects a low battery condition as well as the replacement of batteries in the remote control. The remote control transmits a low battery message to a controlled device responsive to detecting a low battery condition. The remote control refrains from transmitting one or more subsequent low battery messages to the controlled device prior to detection of replacement of batteries. The remote control transmits a battery status message to the controlled device responsive to detecting the replacement of batteries in the remote control. The controlled device utilizes the low battery message and the battery status message to determine whether to present a low battery indicator to a user regarding a low battery condition of the remote control.

20 Claims, 4 Drawing Sheets

U.S. PATENT DOCUMENTS

| | | | |
|---|---|---|---|
| 5,204,657 | A | 4/1993 | Prosser |
| 5,294,915 | A | 3/1994 | Owen |
| 5,455,560 | A | 10/1995 | Owen |
| 5,506,572 | A | 4/1996 | Hills et al. |
| 5,519,760 | A | 5/1996 | Borkowski et al. |
| 5,583,491 | A | 12/1996 | Kim |
| 5,598,143 | A | 1/1997 | Wentz |
| 5,638,050 | A | 6/1997 | Sacca et al. |
| 5,684,471 | A | 11/1997 | Bernardi et al. |
| 5,705,997 | A | 1/1998 | Park |
| 5,926,090 | A | 7/1999 | Taylor et al. |
| 5,945,918 | A | 8/1999 | McGonigal et al. |
| 5,963,010 | A | 10/1999 | Hayashi et al. |
| 5,990,868 | A | 11/1999 | Frederick |
| 5,999,799 | A | 12/1999 | Hu et al. |
| 6,002,450 | A | 12/1999 | Darbee et al. |
| 6,191,551 | B1 | 2/2001 | Fischer et al. |
| 6,230,277 | B1 | 5/2001 | Nakaoka et al. |
| 6,295,002 | B1 * | 9/2001 | Fukuda ............... 340/636.1 |
| 6,373,256 | B1 | 4/2002 | Hanjani |
| 6,407,779 | B1 | 6/2002 | Herz |
| 6,426,736 | B1 | 7/2002 | Ishihara |
| 6,449,726 | B1 | 9/2002 | Smith |
| 6,535,125 | B2 | 3/2003 | Trivett |
| 6,570,507 | B1 | 5/2003 | Lee et al. |
| 6,573,832 | B1 | 6/2003 | Fugere-ramirez |
| 6,633,281 | B2 | 10/2003 | Lin et al. |
| 6,664,744 | B2 | 12/2003 | Dietz |
| 6,725,064 | B1 | 4/2004 | Wakamatsu et al. |
| 6,771,182 | B1 | 8/2004 | Loh et al. |
| 6,791,467 | B1 | 9/2004 | Ben-Ze'ev |
| 6,938,101 | B2 | 8/2005 | Hayes et al. |
| 6,985,069 | B2 | 1/2006 | Marmaropoulos |
| 7,009,528 | B2 | 3/2006 | Griep |
| 7,047,333 | B2 | 5/2006 | Leung et al. |
| 7,362,227 | B2 | 4/2008 | Kim |
| 7,474,248 | B2 | 1/2009 | Nakamura et al. |
| 7,738,792 | B2 | 6/2010 | Flachs et al. |
| 7,757,105 | B2 | 7/2010 | Okazaki |
| 7,852,255 | B2 | 12/2010 | Rapisarda |
| 7,907,060 | B2 | 3/2011 | Reams |
| 8,009,054 | B2 | 8/2011 | Reams |
| 2002/0085128 | A1 | 7/2002 | Stefanik |
| 2002/0093481 | A1 | 7/2002 | Kehlstadt |
| 2003/0026424 | A1 | 2/2003 | McGarrahan et al. |
| 2003/0035074 | A1 | 2/2003 | Dubil et al. |
| 2003/0145242 | A1 | 7/2003 | Derocher et al. |
| 2003/0159146 | A1 | 8/2003 | Kim |
| 2004/0095152 | A1 | 5/2004 | Ho |
| 2004/0096051 | A1 | 5/2004 | Kim et al. |
| 2004/0130527 | A1 | 7/2004 | Endo et al. |
| 2004/0148632 | A1 | 7/2004 | Park et al. |
| 2004/0155860 | A1 | 8/2004 | Wenstrand et al. |
| 2004/0161031 | A1 | 8/2004 | Kwentus et al. |
| 2004/0203374 | A1 | 10/2004 | Zilliacus |
| 2004/0235446 | A1 | 11/2004 | Flaherty et al. |
| 2004/0250273 | A1 | 12/2004 | Swix et al. |
| 2004/0252247 | A1 | 12/2004 | Wabiszczewicz |
| 2005/0033887 | A1 | 2/2005 | Kim et al. |
| 2005/0073497 | A1 | 4/2005 | Kim |
| 2005/0146438 | A1 | 7/2005 | Giger |
| 2005/0225301 | A1 | 10/2005 | Arnold et al. |
| 2006/0017581 | A1 * | 1/2006 | Schwendinger et al. .. 340/636.1 |
| 2006/0034611 | A1 | 2/2006 | Li |
| 2006/0081771 | A1 | 4/2006 | Eliad Wardimon |
| 2007/0018845 | A1 | 1/2007 | Sutardja |
| 2007/0080823 | A1 | 4/2007 | Fu et al. |
| 2007/0130609 | A1 | 6/2007 | Han et al. |
| 2007/0185968 | A1 | 8/2007 | White et al. |
| 2007/0279332 | A1 | 12/2007 | Fryer et al. |
| 2008/0024435 | A1 | 1/2008 | Dohta |
| 2008/0040758 | A1 | 2/2008 | Beetcher et al. |
| 2008/0098426 | A1 | 4/2008 | Candelore |
| 2008/0163049 | A1 | 7/2008 | Krampf |
| 2008/0232209 | A1 | 9/2008 | Vergoossen et al. |
| 2008/0267435 | A1 | 10/2008 | Schumaier |
| 2008/0312852 | A1 | 12/2008 | Maack |
| 2009/0002218 | A1 | 1/2009 | Rigazio et al. |
| 2009/0007001 | A1 | 1/2009 | Morin et al. |
| 2009/0077396 | A1 | 3/2009 | Tsai et al. |
| 2009/0122206 | A1 | 5/2009 | Jung |
| 2009/0174653 | A1 | 7/2009 | Shin et al. |
| 2009/0241052 | A1 | 9/2009 | Ha et al. |
| 2009/0243909 | A1 | 10/2009 | Reams |
| 2009/0249086 | A1 | 10/2009 | Reams |
| 2009/0262254 | A1 | 10/2009 | Reams |
| 2009/0278701 | A1 | 11/2009 | Reams |
| 2009/0303097 | A1 | 12/2009 | Reams et al. |
| 2009/0322583 | A1 | 12/2009 | Reams et al. |
| 2009/0328232 | A1 | 12/2009 | Safford, III |
| 2010/0150067 | A1 | 6/2010 | Penisoara et al. |
| 2010/0238046 | A1 | 9/2010 | Lee et al. |
| 2011/0285540 | A1 | 11/2011 | Reams |

FOREIGN PATENT DOCUMENTS

| | | | |
|---|---|---|---|
| JP | 10334380 A | * | 12/1998 |
| JP | 00130848 | | 5/2000 |
| JP | 2004092946 A | | 3/2004 |
| JP | 2006020386 A | * | 1/2006 |

OTHER PUBLICATIONS

USPTO "Non-Final Office Action" mailed Jun. 25, 2010; U.S. Appl. No. 12/117,628, filed May 8, 2008.

USPTO "Notice of Allowance" mailed Jan. 6, 2011; U.S. Appl. No. 12/117,628, filed May 8, 2008.

USPTO "Supplemental Notice of Allowability" mailed Feb. 9, 2011; U.S. Appl. No. 12/117,628, filed May 8, 2008.

USPTO "Non-Final Office Action" mailed Mar. 13, 2012; U.S. Appl. No. 13/188,280, filed Jul. 21, 2011.

European Patent Office "International Search Report" mailed Jul. 2, 2009 for International Appln. PCT/US2009/039948.

USPTO "Non-Final Office Action" mailed Jun. 25, 2010; U.S. Appl. No. 12/104,291, filed Apr. 16, 2008.

USPTO "Final Office Action" mailed Jan. 6, 2011; U.S. Appl. No. 12/104,291, filed Apr. 16, 2008.

European Patent Office "International Search Report" mailed Jul. 20, 2009 for International Appln. PCT/US2009/037856.

European Patent Office "International Search Report" mailed Jun. 24, 2009 for International Appln. PCT/US2009/037871.

European Patent Office "International Search Report" mailed Aug. 27, 2009 for International Appln. PCT/US2009/044302.

European Patent Office "International Search Report" mailed May 26, 2010 for International Appln. PCT/US2010/026694.

Osoinach, Bryce "Proximity Capacitive Sensor Technology for Touch Sensing Applications," Proximity Sensing White Paper prepared for Freescale Semiconductor, Inc., Tempe, Arizona, 2007, 12 pages.

USPTO "Non-Final Office Action" mailed Oct. 8, 2010; U.S. Appl. No. 12/056,520, filed Mar. 27, 2008.

Amendment and Response to Office Action dated Jan. 10, 2011; U.S. Appl. No. 12/056,520, filed Mar. 27, 2008.

USPTO "Non-Final Office Action" mailed Jan. 27, 2011; U.S. Appl. No. 12/056,520, filed Mar. 27, 2008.

Amendment and Response to Office Action dated Oct. 25, 2010; U.S. Appl. No. 12/117,628, filed May 8, 2008.

USPTO "Non-Final Office Action" mailed Feb. 14, 2011; U.S. Appl. No. 12/135,370, filed Jun. 9, 2008.

USPTO "Final Office Action" mailed Jun. 9, 2011; U.S. Appl. No. 12/135,370, filed Jun. 9, 2008.

USPTO "Non-Final Office Action" mailed Oct. 26, 2011; U.S. Appl. No. 12/135,370, filed Jun. 9, 2008.

USPTO "Non-Final Office Action" mailed Mar. 3, 2011; U.S. Appl. No. 12/404,848, filed Mar. 16, 2009.

USPTO "Notice of Allowance" mailed May 3, 2011; U.S. Appl. No. 12/104,291, filed Apr. 16, 2008.

USPTO "Notice of Allowance" mailed Dec. 15, 2011; U.S. Appl. No. 12/404,848, filed Mar. 16, 2009.

Amendment and Response to Office Action dated Mar. 23, 2011; U.S. Appl. No. 12/056,520, filed Mar. 27, 2008.

USPTO "Final Office Action" mailed Apr. 15, 2011; U.S. Appl. No. 12/056,520, filed Mar. 27, 2008.

Amendment and Response to Office Action dated Jun. 13, 2011; U.S. Appl. No. 12/056,520, filed Mar. 27, 2008.

USPTO "Notice of Allowance" mailed Sep. 20, 2011; U.S. Appl. No. 12/056,520, filed Mar. 27, 2008.

* cited by examiner

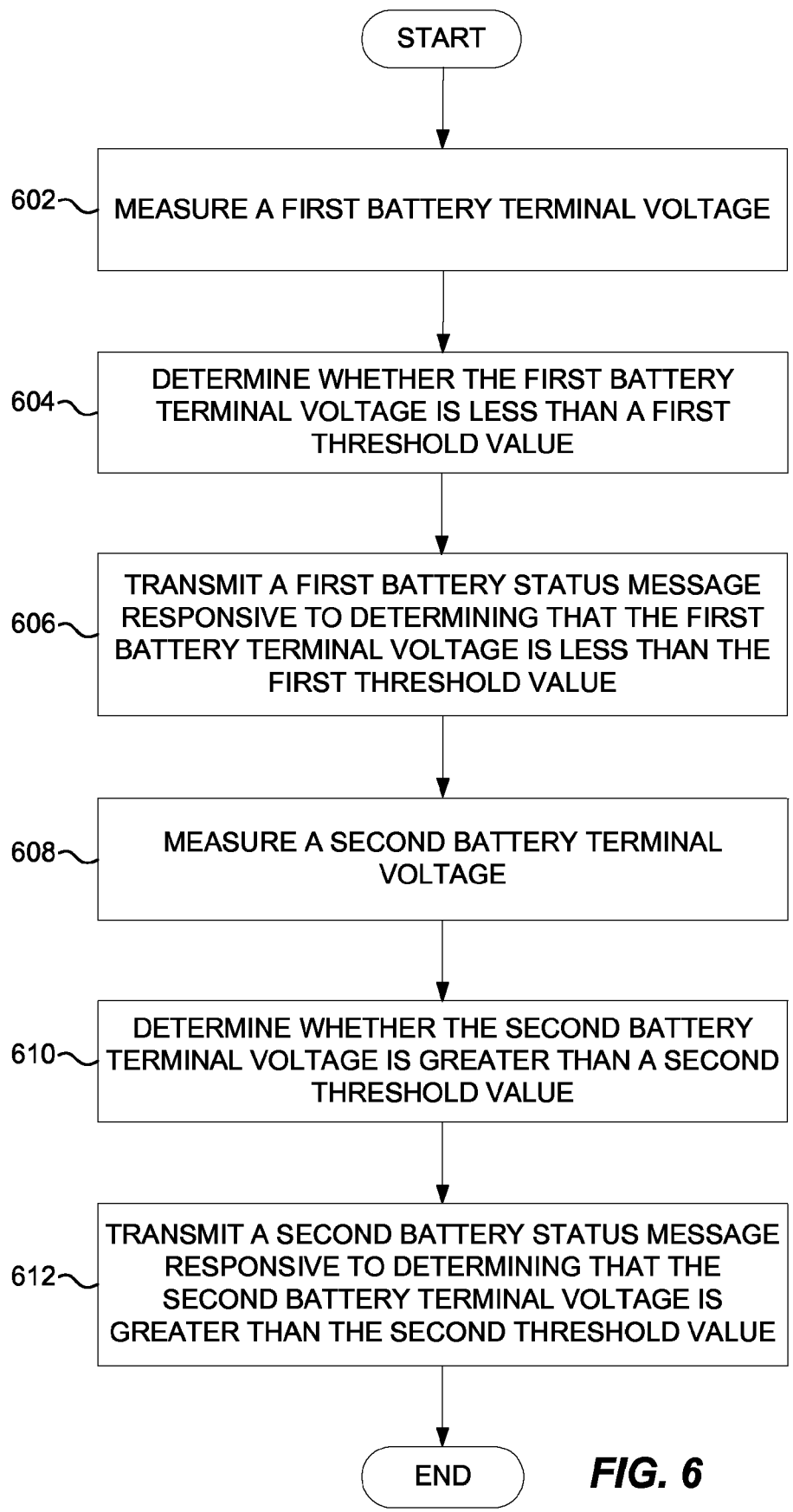

SYSTEMS AND APPARATUS FOR BATTERY REPLACEMENT DETECTION AND REDUCED BATTERY STATUS TRANSMISSION IN A REMOTE CONTROL

RELATED APPLICATIONS

This application is a continuation of non-provisional United States patent application having Ser. No. 12/117,628, entitled "SYSTEMS, METHODS AND APPARATUS FOR DETECTING REPLACEMENT OF A BATTERY IN A REMOTE CONTROL," filed on May 8, 2008, which is hereby incorporated herein by reference in its entirety.

BACKGROUND

Many remote controls for entertainment devices include a feature that detects a low battery condition and alerts the user of the low battery condition. For example, a remote control for a satellite television receiver may detect that the battery powering the remote control only has 10% of its usable life left. The remote control may communicate the low battery condition to the satellite television receiver, and the receiver may present an indicator to a user regarding the low battery condition. Thus, the user may take action to replace the batteries to avoid experiencing a subsequent dead battery in the remote control.

Remote controls communicate the low battery condition to a receiver or other type of entertainment device by transmitting a unique key code or message that indicates the low battery condition. A remote control typically transmits the unique key code on every button press upon which a low battery condition is detected. The entertainment device utilizes the received key code to determine whether to present a low battery indicator to a user. However, the repeated transmission of low battery key codes requires power to be drawn from the battery, further reducing the life of the battery in the remote control.

BRIEF DESCRIPTION OF THE DRAWINGS

The same number represents the same element or same type of element in all drawings.

FIG. 6 illustrates an embodiment of a process for indicating a low battery condition in a remote control for an entertainment device.

DETAILED DESCRIPTION

Figure 1:
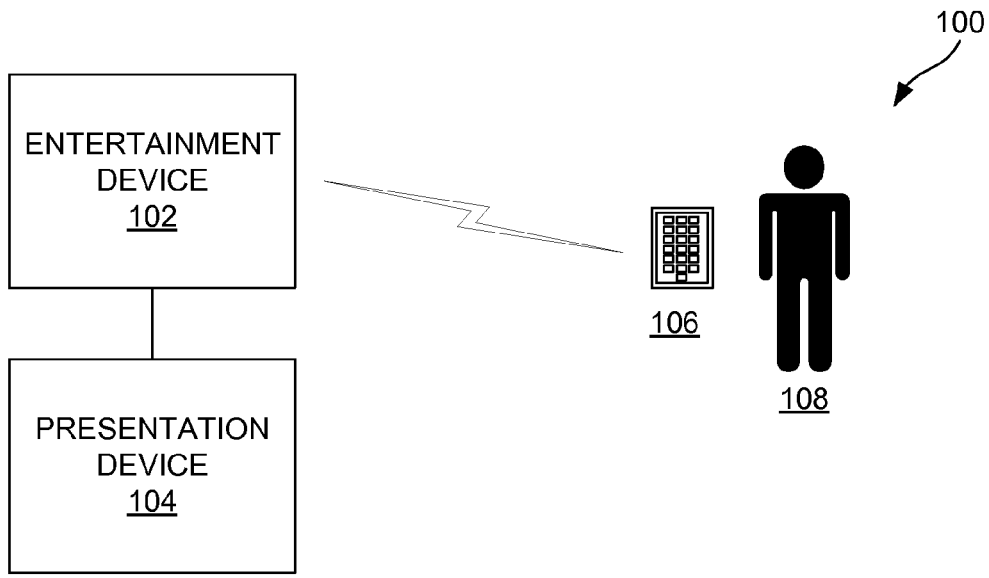
FIG. 1 illustrates an embodiment of an entertainment system.

The various embodiments described herein generally provide apparatus, systems and methods for indicating to a user a low battery condition of a remote control for an entertainment device. More particularly, the various embodiments described herein generally provide apparatus, systems and methods which detect low battery conditions in a remote control as well as the replacement of batteries in the remote control. A remote control and a controlled device cooperatively operate to utilize the detection of the low battery condition and the detection of the battery replacement to determine whether to prompt a user to replace the batteries in the remote control.

A remote control is configured to detect low battery conditions and transmit a low battery message to a controlled device responsive to detecting a low battery condition. Thus, the controlled device may present a low battery indicator to a user regarding the low battery condition responsive to receiving the low battery message. In at least one embodiment, the remote control stores a counter, register value, flag or other type of indicator to determine whether a low battery message has been transmitted to the controlled device. The indicator may be reset each time the batteries in the remote control are changed. Thus, in at least one embodiment, the remote control transmits the low battery message to the entertainment device once per set of batteries (or per charge in the case of rechargeable batteries). In some embodiments, the remote control may bi-directionally communicate with the controlled device. Thus, the remote control may receive an acknowledgment from the controlled device regarding the low battery message, and may store a value indicating the receipt of an acknowledgment from the controlled device.

Similarly, the remote control is configured to detect when the batteries have been replaced and transmit a battery status message to the controlled device responsive to detecting the battery replacement. The battery status message indicates that the batteries are good (e.g., have been replaced or recharged). Thus, responsive to the battery status message, the controlled device may cease presenting the low battery indicator to a user. Because the controlled device determines whether to present low battery indicators based on a pair of low battery and battery status messages, repeated transmissions of low battery messages accompanying each button press for each set of batteries are not necessary. The elimination of repeated transmissions of low battery messages saves battery draw of the remote control, contributing to a longer useable life of the batteries for the remote control.

In at least one embodiment the controlled device periodically polls the remote control for its battery state. The remote control responds with a message containing data related to the battery voltage. The controlled device utilizes this data to determine whether the battery is low or good.

The controlled device is described herein as an entertainment device. However, it is to be appreciated that the teachings described herein may be applied to other combinations of remote controls and controlled devices. For example, the teachings described herein may be applied to household appliances, computers and wireless peripherals (e.g., keyboards, mice and pointing devices), automobile keyless entry systems and the like. Further, the terms "battery" and "batteries" will be used interchangeably herein. It is to be appreciated that the term "battery" as used herein may refer to a single electrical cell (e.g., a AA battery) which is commonly referred to as a "battery", and the terms "battery" and "cell" will be used interchangeably herein. It is also to be appreciated that the teachings described herein may be applied to remote controls powered by a single removable cell/battery or multiple removable cells/batteries.

FIG. 1 illustrates an embodiment of an entertainment system 100. The entertainment system 100 presents content to a user 108. In at least one embodiment, the content presented to the user 108 includes an audio/video stream, such as a television program, movie or other recorded content and the like. The entertainment system 100 includes an entertainment device 102, a presentation device 104 and a remote control 106. Each of these components is discussed in greater detail below. The entertainment system 100 may include other devices, components or elements not illustrated for the sake of brevity.

The entertainment device 102 is operable to receive content from one or more content sources (not shown in FIG. 1), and to present the received content to the user 108 on the associated presentation device 104. In at least one embodiment, the presentation device 104 is a display device (e.g., a television) configured to display content to the user 108. The entertainment device 102 may receive an audio/video stream in any format (e.g., analog or digital format), and output the audio/video stream for presentation by the presentation device 104. The entertainment device 102 may be further configured to display menus and other information that allow a user 108 to control the output of content by the entertainment device 102. In at least one embodiment, the entertainment device 102 is a set-top box (e.g., a satellite or cable television converter box), digital video recorder (DVR) or other similar device that processes and provides one or more audio and/or video output streams to the presentation device 104 for presentation to the user 108. In some embodiments, the entertainment device 102 and the presentation device 104 may be integrated as a device combining the functionality of a display device and a set-top box, digital video recorder (DVR) or the like.

The remote control 106 may comprise any system or apparatus configured to remotely control the output of content by the entertainment device 102. For example, the remote control 106 may communicate commands to the entertainment device 102 requesting to playback content, temporally move through content (e.g., fast-forward or reverse), adjust the volume, access electronic programming guides and the like. In some embodiments, the remote control 106 may additionally be configured to remotely control the presentation device 104. The remote control 106 may communicate with the entertainment device 102 and/or the presentation device 104 through any type of wireless communication medium, such as infrared (IR) signals or radio-frequency (RF) signals.

The remote control 106 is powered by one or more batteries. The batteries may be removeable or rechargeable through an associated charging station. The batteries may be any type or size of battery, such as AA batteries or AAA batteries typically used to power consumer electronic devices, such as remote controls. Further, the removable batteries may comprise any type of battery typically used to power consumer electronic devices, such as alkaline batteries, nickel metal hydride (NiMH) batteries, nickel cadmium (NiCad) batteries or Lithium Ion batteries. The remote control 106 is configured to detect a low battery condition when the batteries have a specified usable life remaining or have discharged to a specified voltage, such that the entertainment system 100 may indicate the low battery condition to the user 108. Thus, the user 108 may replace the batteries powering the remote control 106 to avoid future interruptions to their viewing experience caused by dead batteries in the remote control 106. In at least one embodiment, the remote control 106 detects the low battery condition by measuring the battery terminal voltage of the batteries powering the remote control and comparing the voltage against a pre-defined threshold.

For example, the entertainment system 100 may indicate to the user 108 when the remaining usable life of the batteries in the remote control 106 reaches 10% or decreases to a specified voltage threshold (e.g., a low battery condition). In at least one embodiment, the remote control 106 detects the existence of the low battery condition and transmits a low battery message to the entertainment device 102 regarding the low battery condition. Thus, the entertainment device 102 may include a message in the presentation stream output to the presentation device 104 responsive to the low battery message. For example, if the presentation stream is an audio/video stream, then the entertainment device 102 may insert a warning message or other type of indicator into the audio/video stream for display by the presentation device 104. The entertainment device 102 may also indicate the low battery condition using a low battery indicator (e.g., an LED) on the exterior of the entertainment device 102.

In at least one embodiment, the remote control 106 stores a flag, counter or other type of internal indicator regarding whether a low battery message has already been transmitted to the entertainment device 102. If the terminal voltage of the batteries is measured during processing of each user input (e.g., each button press) of the remote control 106, then the remote control 106 may detect the low battery condition multiple times. Further, the battery terminal voltage may fluctuate upon each button press depending on several variables, such as the current drawn and the elapsed time between button presses. Thus, a low battery condition may be detected for one button press, but may not be detected upon a subsequent button press because the battery terminal voltage is fluctuating around a voltage threshold value. If the remote control 106 tracks whether a low battery message has already been transmitted for a particular set of batteries, then it is not necessary to transmit multiple low battery messages to the entertainment device 102. In other embodiments, the remote control 106 may maintain a counter of how many times the low battery message has been transmitted to the entertainment device. Thus, the low battery message may be transmitted multiple times in case the entertainment device 102 does not receive one of the transmissions. For example, the remote control 106 may be configured to transmit the low battery message up to three times per set of batteries. If the remote control 106 includes two-way communication capability, then the remote control 106 may continue to transmit the low battery message until an acknowledgment is received from the entertainment device 102.

The remote control 106 is further configured to detect when the batteries in the remote control 106 have been replaced. The remote control 106 may detect a battery replacement through a variety of techniques. In at least one embodiment, the remote control 106 determines that the battery terminal voltage has increased above a set threshold, indicating that a replacement set of batteries has been inserted into the remote control 106. In another embodiment, the remote control 106 determines that the battery terminal voltage increased a specified value or a specified percentage between measurement intervals. Other exemplary techniques for detecting a battery replacement include detecting the removal of a battery compartment cover, providing a switch or button for the user 108 to press upon replacement of the batteries, or providing the user with an menu via a user interface to select the battery type.

Responsive to detecting the battery replacement, the remote control 106 transmits a battery status message to the entertainment device 102. In at least one embodiment, the remote control 106 further resets a flag to zero, indicating that no low battery message has been transmitted for the particular set of replacement batteries. The entertainment device 102 utilizes the low battery message and the battery status message to determine whether to present a low battery condition indicator to the user 108.

For example, the entertainment device 102 may initially present a low battery indicator to the user 108 responsive to receiving the low battery message. The entertainment device 102 may continue presenting the low battery indicator to the user 108 until receiving the battery status message that indicates that the battery is good. Responsive to receiving the battery status message, the entertainment device 102 ceases outputting the low battery condition indicator until another low battery message is received from the remote control 106.

Figure 2:
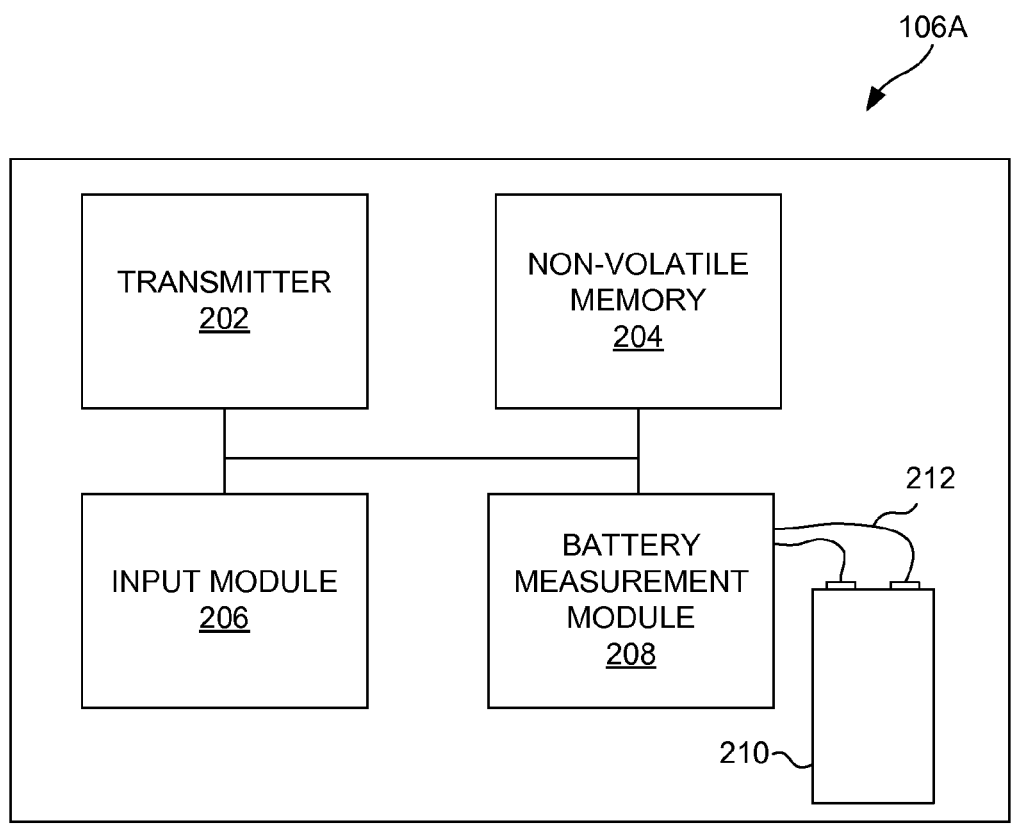
FIG. 2 illustrates an embodiment of a remote control of the entertainment system of FIG. 1.

FIG. 2 illustrates an embodiment of a remote control 106A of the entertainment system 100 of FIG. 1. FIG. 2 will be discussed in reference to the entertainment system 100 illustrated in FIG. 1. The remote control 106A includes a transmitter 202, a non-volatile memory 204, an input module 206, a battery measurement module 208, a battery 210 and a battery connector 212. Each of these components is discussed in greater detail below. The remote control 106A may contain other devices, such as pointing devices (e.g., touchpads), not mentioned herein for the sake of brevity.

The input module 206 is operable for receiving user input from the user 108 (see FIG. 1). In at least one embodiment, the input module 206 is a keypad including a set of buttons. The user 108 (see FIG. 1) may utilize the keypad to input channel numbers, control the volume of the entertainment device 102, navigate menus, manipulate the output of content by the entertainment device 102 and/or control other functions of the entertainment device 102 and/or the presentation device 104. The input module 206 further includes a processor operable to generate control commands for the entertainment device 102 (see FIG. 1) responsive to the user input. The control commands may be in the form of key codes that are compatible with the entertainment device 102 (see FIG. 1).

The transmitter 202 is operable for wirelessly communicating with the entertainment device 102 (see FIG. 1) and/or the presentation device 104. More particularly, the transmitter 202 is operable for transmitting a key code and/or command message corresponding with user input to the entertainment device 102 (see FIG. 1). The transmitter 202 may utilize any type of wireless protocol and wireless communication medium, including RF or IR key codes, to communicate with the entertainment device 102 (see FIG. 1) and/or the presentation device 104. In at least one embodiment, the transmitter 202 is a transceiver that bi-directionally communicates with the entertainment device 102. For example, the remote control 106A may receive IR database or firmware updates from the entertainment device 102A and/or acknowledgments of messages sent to the entertainment device 102.

The remote control 106A further includes a battery connector 212 that connects to a battery 210 powering the remote control 106A. The battery connector 212 includes terminals for connecting to the battery 210. The battery connector 212 may comprise any type of connector that connects to the battery 210 to draw power for supplying other components of the remote control 106A. For example, the battery connector 212 may include two opposing connections for connecting to the terminals of a AA or AAA battery. In at least one embodiment, the battery connector 212 is configured to connect to multiple batteries, such as 2 or 4 AAA batteries.

The battery measurement module 208 is operable to detect low battery conditions of the remote control 106A. More particularly, the battery measurement module 208 is operable to determine whether a battery terminal voltage of the battery 210 is less than a low battery threshold value, indicating a low battery condition. The battery terminal voltage may be measured during any type of processing operation. For example, the battery measurement module 208 may measure the battery terminal voltage during processing of user input by the input module 206. The battery measurement module 208 may also measure the battery terminal voltage during transmission and/or reception of data by the transmitter 202 or a transceiver of the remote control 106A.

In at least one embodiment, the battery measurement module 208 includes an analog-to-digital converter utilized to perform measurement functions for determining whether the battery terminal voltage of the battery 210 is less than the low battery threshold value. The low battery threshold value may be selected based on any desired design criteria. For example, a low battery threshold value of 1.05 V may be selected to indicate that the remaining usable life of an alkaline battery is ~20%. Responsive to the battery measurement module 208 detecting the low battery condition, the transmitter 202 operates to transmit a low battery message to the entertainment device 102. The entertainment device 102 utilizes the low battery message to present a low battery indicator to the user 108.

The battery measurement module 208 is further operable to detect when the battery 210 in the remote control 106A has been replaced or recharged. A battery replacement may be detected by comparing a measured battery terminal voltage with a reference value. In at least one embodiment, the battery measurement module 208 is operable to determine whether the battery terminal voltage is greater than a reference voltage. The reference voltage indicates when the battery has been replaced, and the reference voltage may be selected based on any desired design criteria. For example, the reference voltage may be selected to indicate that a battery has a significant portion of its usable life remaining (e.g., greater than 50%).

Figure 3:
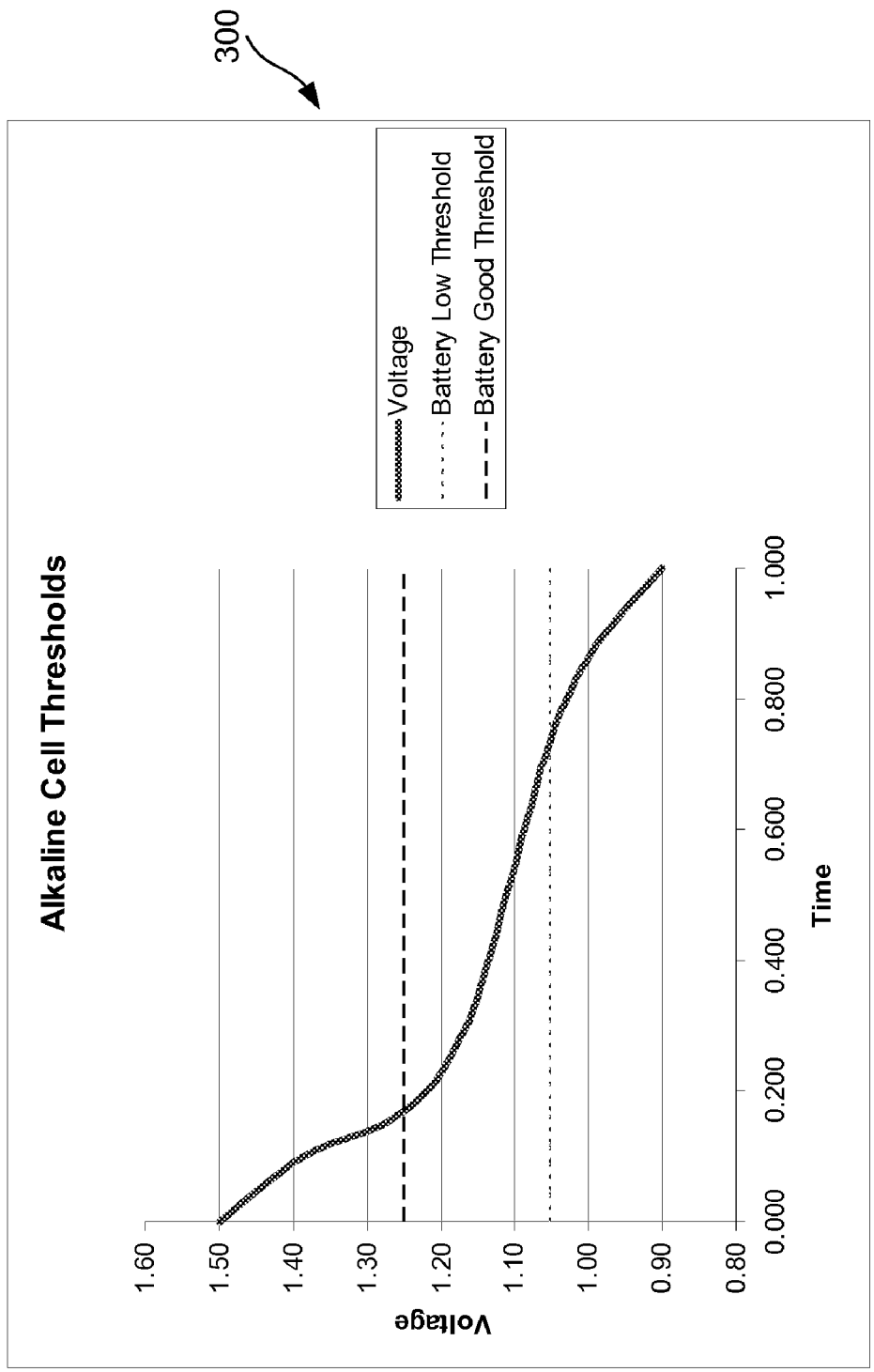
FIG. 3 illustrates an embodiment of a graph of the normalized relationship between battery terminal voltages and time for an alkaline cell.

FIG. 3 illustrates an embodiment of a graph 300 of the normalized relationship between battery terminal voltages and time for an alkaline cell. At time 0.000, the battery terminal voltage of a 1.5 V battery will be measured as ~1.5 V. The battery terminal voltage decreases as the battery is used. Additionally, the battery terminal voltage also gradually decreases with age even if the battery has not been used (i.e., self discharge). For example, a battery that has been in the package for two years may only have a battery terminal voltage of ~1.4 V when inserted into the remote control 106A (see FIG. 2). Thus, as illustrated in FIG. 3, a voltage of ~1.25 V corresponds with approximately 80% of the remaining life of an alkaline battery. Thus, 1.25 V may be an appropriate replacement battery threshold for detecting a battery replacement in at least one embodiment. Similarly, as illustrated in FIG. 3, 1.05 V may be selected as an appropriate threshold for warning a user regarding a low battery condition in at least one embodiment.

Returning to FIG. 2, responsive to the battery measurement module 208 detecting a battery replacement, the transmitter 202 operates to transmit a battery status message to the entertainment device 102 (see FIG. 1). The entertainment device 102 processes the battery status message to determine whether to present a low battery condition indicator to the user 108. In other words, the entertainment device 102 may utilize the battery status message to determine whether to stop presenting a low battery condition indicator to the user 108.

As described above, one technique for detecting a battery replacement involves comparing a battery terminal voltage with a threshold value indicating that a battery has been replaced. However, different types of batteries, such as alkaline batteries, nickel metal hydride (NiMH) batteries, nickel cadmium (NiCad) batteries or Lithium Ion batteries each have different types of discharge curves. Thus, a threshold value indicating replacement of batteries that is appropriate for one type of battery may be inappropriate for other types of batteries. Thus, in at least one embodiment, the battery measurement module 208 may alternatively be configured to measure relative increases in the battery terminal voltage to detect replacement of the battery 210.

More particularly, the battery measurement module 208 compares a measured battery terminal voltage with a previously measured battery terminal voltage to determine a battery terminal voltage increase. The battery measurement module 208 further determines whether the battery terminal voltage increase is greater than an increase threshold value. A battery terminal voltage greater than the increase threshold value indicates that the battery 210 has been replaced. The increase threshold value may be selected as greater than expected voltage fluctuations of the battery. Not illustrated in FIG. 3 are dips that occur when current is drawn from the battery 210. For example, when the input module 206 processes a button press, the battery terminal voltage may decrease by as much as several tens of millivolts. However, after an adequate recovery time, the battery terminal voltage may increase back to substantially its original value prior to the button press. Thus, the increase threshold value may be appropriately selected to avoid sending battery replacement messages responsive to small fluctuations in the battery terminal voltage caused by normal use of the battery 210.

In at least one embodiment, the battery measurement module 208 maintains a register storing the most recently measured quiescent (non-surge) battery terminal voltage. For example, the battery measurement module 208 may utilize an increase threshold value of 0.10 V. The battery measurement module 208 previously measures a quiescent battery terminal voltage of 1.03 V, which is stored in the register. Subsequently, the battery measurement module 208 measures a battery terminal voltage of 1.15 V. The difference is 0.12 V, which is greater than the increase threshold value of 0.10 V. This indicates that the remaining usable life of the battery 210 has increased ~40%. Thus, it is likely that the battery 210 has been replaced by a new battery 210.

In another embodiment, the increase threshold value utilized by the battery measurement module 208 may be a percentage change between two measured battery terminal voltages. For example, the battery measurement module 208 may utilize an increase threshold value of 25%. The battery measurement module 208 may measure a first battery terminal voltage of 1.00 V. The battery measurement module 208 may subsequently measure a second battery terminal voltage of 1.40 V. The voltage difference increased 40% between the measurements, which is greater than the increase threshold value of 25%. Thus, it is likely that the battery 210 has been replaced by a new battery 210.

Figure 4:
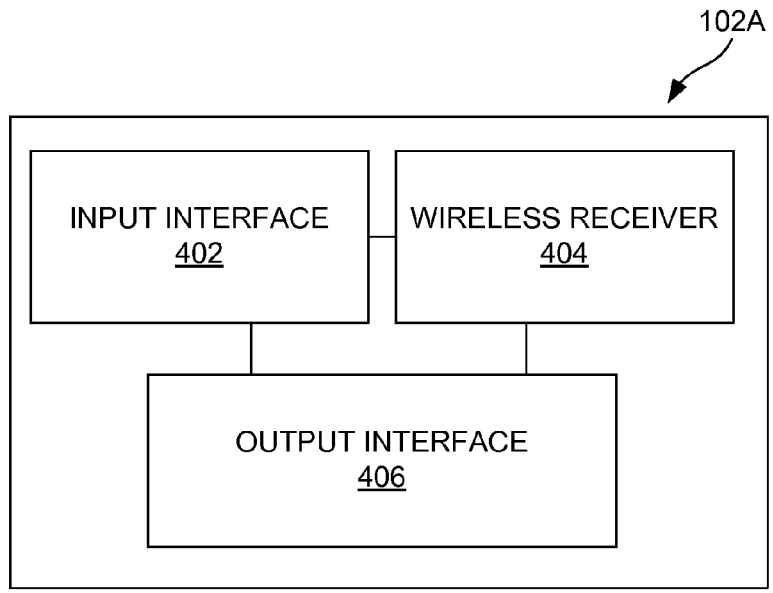
FIG. 4 illustrates an embodiment of an entertainment device of FIG. 1.

FIG. 4 illustrates an embodiment of an entertainment device 102A of FIG. 1. More particularly, FIG. 4 illustrates an entertainment device 102A embodied as a television receiver (e.g., a set-top box). However, it is to be appreciated that the entertainment device 102A may comprise any type of device that presents any type of presentation content. FIG. 4 will be discussed in reference to the entertainment system 100 illustrated in FIG. 1. The entertainment device 102A includes an input interface 402, a wireless receiver 404 and an output interface 406. Each of these components will be discussed in greater detail below. The entertainment device 102A may include other components or devices not illustrated for the sake of brevity.

The input interface 402 is operable for receiving presentation content, e.g., video content. The input interface 402 may be operable for receiving and tuning any type of video content. For example, the input interface 402 may receive an over-the-air broadcast signal, a direct broadcast satellite signal or a cable television signal. In at least one embodiment, the input interface 402 may receive or retrieve content from a storage medium, such as an optical disk, internal or external hard drive, a portable storage device (e.g., universal serial bus (USB) memory sticks) and the like. The input interface 402 may also receive content from external servers, such as video servers, that are communicatively coupled to the entertainment device 102A over the internet or other types of data networks.

The wireless receiver 404 is operable to wirelessly receive and/or transmit data to the remote control 106 (see FIG. 1). The wireless receiver 404 may communicate with the remote control 106 utilizing any type of IR or RF communication link. In at least one embodiment, the wireless receiver 404 receives a key code or command from the remote control 106, and responsively provides the key code to the output interface 406. The wireless receiver 404 is further operable to receive other data from the remote control 106, such as low battery messages indicating a low battery condition in the remote control 106 or battery status messages indicating that the batteries in the remote control 106 (see FIG. 1) have been replaced or recharged. In at least one embodiment, the wireless receiver 404 comprises a wireless transceiver operable to bi-directionally communicate data with the remote control 106. For example, the entertainment device 102A may acknowledge commands, transmit IR database code updates, firmware updates and the like to the remote control 106.

The output interface 406 is operable for controlling the operation of the entertainment device 102A. In at least one embodiment, the output interface 406 receives video content and responsively generates an output stream for presentation on a presentation device 104. The output interface 406 is further operable to receive a key code and manipulate the output of the video content responsive to the key code. In other words, the output interface 406 operates responsive to the key code to control an output stream of video content.

Figure 5:
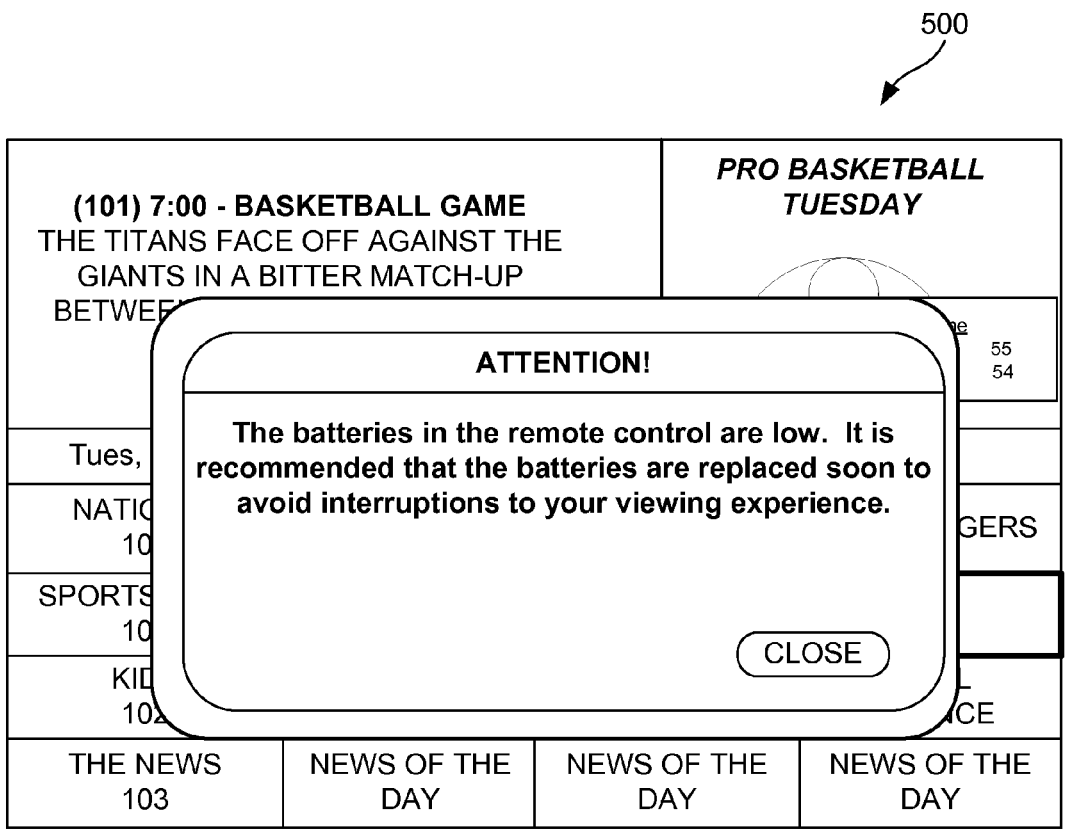
FIG. 5 illustrates an embodiment of a screenshot including a warning message regarding a low battery condition.

The output interface 406 is further operable to receive a low battery message and/or a battery status message to determine whether to output an indicator to the user 108 regarding a low battery condition of the remote control 106. For example, the output interface 406 may output a warning message in a video stream for presentation by the presentation device 104 responsive to receiving the low battery message. FIG. 5 illustrates an embodiment of a screenshot 500 including a warning message regarding a low battery condition. The user 108 may take appropriate action responsive to the warning message to replace the batteries in the remote control to avoid disruptions to their viewing experience. Other indicators, such as audible indicators, blinking lights and the like may also be utilized by the entertainment device 102 to alert the user 108 regarding the low battery condition. The output interface 406 further operates responsive to the battery replacement message to remove the warning message or otherwise cease indicating to a user 108 the existence of a low battery condition in the remote control 106.

FIG. 6 illustrates an embodiment of a process for indicating a low battery condition in a remote control for an entertainment device. The process of FIG. 6 will be discussed in reference to a television receiver. However, it is to be appreciated that the process may be applied to indicate low battery conditions in remote controls for other types of controlled devices. The process of FIG. 6 is not all inclusive, and may include other operations not illustrated for the sake of brevity.

The process includes measuring a first battery terminal voltage of the remote control (operation 602). The measurement of the first battery terminal voltage may be measured at any time. For example, the first battery terminal voltage may be measured during processing of user input by the remote control or during reception of data by the remote control from the television receiver.

The process further includes determining whether the first battery terminal voltage is less than a first threshold value (operation 604). If the first battery terminal voltage is greater than the first threshold value, then no low battery condition is present in the remote control, and the operation of the process ends until another iteration is needed responsive to additional processing functions performed by the remote control. Otherwise, the process further includes transmitting a first battery status message to the television receiver responsive to determining that the first battery terminal voltage is less than the first threshold value (operation 606). The process may optionally include setting a flag, incrementing a counter, or otherwise updating an indicator regarding the transmission of the first battery status message.

The process further includes measuring a second battery terminal voltage of the remote control (operation 608). Like the measurement of the first battery terminal voltage, the second battery terminal voltage may be measured at any time. In some embodiments, the measurement of the second battery terminal voltage is conditionally performed in the event that a low battery condition has already been detected in the remote control.

The process further includes determining whether the second battery terminal voltage is greater than a second threshold value (operation 610). If the second battery terminal voltage is less than the second threshold value, then the battery has not yet been replaced, and processing ends until another iteration is needed responsive to additional processing functions performed by the remote control. After a low battery condition has been detected by the remote control in operations 604 and 606, subsequent iterations of the process of FIG. 6 may begin at operation 608.

The process further includes transmitting a second battery status message to the television receiver responsive to determining that the second battery terminal voltage is greater than the second threshold value (operation 612). The television receiver processes the first battery status message and the second battery status message to determine whether to present an indicator to a user regarding a low battery condition of the remote control. For example, a low battery indicator may be presented by the television receiver during the interval after receiving the first battery status message and prior to receiving the second battery status message.

Although specific embodiments were described herein, the scope of the invention is not limited to those specific embodiments. The scope of the invention is defined by the following claims and any equivalents therein.

I claim:

1. A system, comprising:
a wireless remote control that includes:
a battery connector with terminals that connect to a battery powering the remote control;
a battery measurement module coupled to the battery connector that measures a first battery terminal voltage at the terminals and that identifies a low battery condition corresponding to the battery based on the measured first battery terminal voltage; and
a transmitter coupled to the input module that transmits control commands to a controlled device and that transmits a low battery status message to the controlled device, wherein the remote control refrains from transmitting a subsequent low battery status message to the controlled device after the low battery status message is transmitted until a battery replacement is detected at the remote control;
the battery measurement module measures a second battery terminal voltage at the terminals and identifies that the battery has been replaced based on the measured second battery terminal voltage;
the transmitter transmits a battery replaced status message to the controlled device;
the controlled device, which includes:
a receiving interface that receives the control commands and the low battery status message from the remote control;
a processor that processes the low battery status message to identify the low battery condition of the remote control;
a presentation interface that presents an indicator to a user regarding the low battery condition of the remote control;
the input interface receives a second battery status message from the remote control;
the processor processes the second battery status message to identify a battery replaced condition of the remote control; and
the presentation interface terminates presentation of the indicator to the user regarding the low battery condition of the remote control; and
the remote control setting a stored indicator to a low battery state responsive to detecting the low battery condition and resetting the stored indicator to a non-low battery state responsive to detecting the battery replacement.

2. The system of claim 1, the controlled device further comprising a transmitter that transmits an acknowledgment message to the remote control, the acknowledgment message indicating that the first battery status message was received at the controlled device, and the remote control further comprising a receiver that receives the acknowledgment message.

3. The system of claim 2, wherein the remote control refrains from transmitting the subsequent low battery message to the controlled device after the receiver of the remote control receives the acknowledgment message until a battery replacement is detected at the remote control.

4. The system of claim 1, wherein the remote control determines the low battery condition by comparing the first battery terminal voltage to a first threshold voltage.

5. The system of claim 4, wherein the battery measurement module identifies that the battery has been replaced by identifying that the second battery terminal voltage has increased above a predetermined second threshold voltage.

6. The system of claim 4, wherein the battery measurement module identifies that the battery has been replaced by identifying that the second battery terminal voltage has increased by a set threshold above a previously measured terminal voltage.

7. The system of claim 6, wherein the set threshold is calculated as a specified voltage increase above the previously measured terminal voltage.

8. The system of claim 6, wherein the set threshold comprises a specified percentage of voltage increase above the previously measured terminal voltage.

9. An apparatus, comprising:
a receiving interface that receives a first battery status message from a wireless remote control;
a processor that processes the first battery status message to identify a low battery condition of the remote control;
a transmitter that transmits a first acknowledgment message to the remote control, the acknowledgment message indicating that the first battery status message was received at the apparatus; and a presentation interface that presents an indicator to a user regarding the low battery condition of the remote control when the processor has identified the low battery condition of the remote control;

the input interface receives a second battery status message from the remote control;

wherein the processor processes the second battery status message to identify a battery replaced condition of the remote control;

wherein the presentation interface terminates presentation of the indicator to the user regarding the low battery condition of the remote control responsive to the processor identifying the battery replaced condition of the remote control; and wherein the transmitter transmits a second acknowledgement to the wireless remote control acknowledging receipt of the battery replaced status message to thereby direct, the remote control to reset a stored indicator from a low battery state to a non-low battery state when the wireless remote control receives the second acknowledgement.

10. The apparatus of claim 9, wherein the first battery status message is a low battery notification message and the second battery status message is a battery replaced notification message.

11. The apparatus of claim 10, wherein, after the transmitter transmits the first acknowledgement message to the remote control, the receiving interface does not receive subsequent low battery notification messages from the remote control until the battery replaced notification message is received from the remote control by the receiving interface of the apparatus.

12. The apparatus of claim 9, wherein the apparatus comprises an entertainment device.

13. The apparatus of claim 12, wherein the receiving interface of the entertainment device is configured to receive a command from the remote control, and the processor is configured to modify the output of presentation content from the presentation interface to the presentation device based on the command.

14. The apparatus of claim 12, wherein the entertainment device is integrated with a display device and is configured to receive content from one or more content sources.

15. The apparatus of claim 9, wherein the apparatus comprises a computer, and the remote control comprises a wireless peripheral device.

16. The apparatus of claim 9, wherein the apparatus comprises an automobile keyless entry system.

17. A remote control comprising:

a battery connector including terminals that connect to a battery powering the remote control;

a battery measurement module coupled to the battery connector that measures a first battery terminal voltage at the terminals and that identifies a low battery condition;

a transmitter coupled to the battery measurement module that transmits one or more low battery status message to a controlled device responsive to the battery measurement module identifying the low battery condition, wherein the controlled device presents a low battery indicator upon receipt of the low battery status message, and the remote control refrains from transmitting subsequent low battery status messages to the controlled device until a battery replacement is detected;

the battery measurement module measures a second terminal voltage at the terminals and identifies that the battery has been replaced based on the measured second terminal voltage; and the transmitter transmits a battery replaced status message to the controlled device responsive to the battery measurement module identifying the battery replacement, wherein the controlled device ceases presentation of the low battery indicator; and the remote control setting a stored indicator to a low battery state responsive to detecting the low battery condition and resetting the stored indicator to a non-low battery state responsive to detecting the battery replacement.

18. The remote control of claim 17, wherein the transmitter sends a fixed number of low battery status messages to the controlled device responsive to the battery measurement module identifying the low battery condition, and refrains from transmitting subsequent low battery status messages to the controlled device until a battery replacement is detected.

19. The remote control of claim 17, further comprising a receiver that receives messages that are transmitted to the remote control by the controlled device, wherein the transmitter of the remote control transmits the one or more low battery status messages to the controlled device prior to the receiver receiving an acknowledgment message from the controlled device, and the transmitter refrains from transmitting subsequent low battery messages to the controlled device once the acknowledgment message is received from the controlled device until a battery replacement is detected by the battery measurement module.

20. The remote control of claim 17, further comprising a stored indicator that indicates whether the remote control has transmitted a low battery status message corresponding to the battery, wherein the stored indicator is set once the remote control transmits the low battery status message to the controlled device and is reset when the battery measurement module identifies that the battery has been replaced.

* * * * *